United States Patent [19]
Bergonzoni et al.

[11] Patent Number: 4,987,088
[45] Date of Patent: Jan. 22, 1991

[54] FABRICATION OF CMOS DEVICES WITH REDUCED GATE LENGTH

[75] Inventors: Carlo Bergonzoni, Arcore; Tiziana Cavioni, Verbania; Giuseppe P. Crisenza, Trezzo sull'Adda, all of Italy

[73] Assignee: SGS-Thomson Microelectronics s.r.l., Agrate Brianza, Italy

[21] Appl. No.: 381,283

[22] Filed: Jul. 18, 1989

[30] Foreign Application Priority Data

Jul. 29, 1988 [IT] Italy ................................ 83653 A/88

[51] Int. Cl.$^5$ ............................................ H01L 21/265
[52] U.S. Cl. ............................................................. 437/34
[58] Field of Search ............................................ 437/34

[56]    References Cited
U.S. PATENT DOCUMENTS

| | | | |
|---|---|---|---|
| 4,459,741 | 7/1984 | Schwabe et al. | 437/34 |
| 4,613,885 | 9/1986 | Haken | 357/42 |
| 4,839,301 | 6/1989 | Lee | 437/29 |

Primary Examiner—Olik Chaudhuri
Assistant Examiner—George R. Fourson
Attorney, Agent, or Firm—Wenderoth, Lind & Ponack

[57] ABSTRACT

A process for fabricating CMOS integrated devices includes forming an n-type deep well diffusion region in a surface of a p-type monocrystalline silicon substrate. Transistor devices having a p-type channel region are formed within the deep well diffusion regions, and transistor devices having an n-type channel region are formed external the deep well diffusion regions. The improvement of the present invention includes the step of performing an unmasked ion implantation of boron over the entire surface of the monocrystalline silicon substrate after having formed the deep well diffusion regions in order to effect simultaneously a partial compensation of a superficial doping level of the deep well diffusion region and an enrichment of a superficial doping level of the monocrystalline silicon substrate external the deep well diffusion region.

2 Claims, No Drawings

FABRICATION OF CMOS DEVICES WITH REDUCED GATE LENGTH

BACKGROUND OF THE INVENTION

1. Field of the Invention

The present invention relates to a process for fabricating doped polycrystalline silicon and/or polycrystalline silicide gate integrated CMOS devices, and more particularly to a process for fabricating devices having a sub-micron gate length designed to operate with a relatively high supply voltage.

2. Description of the Prior Art

According to state-of-the-art fabrication technology of CMOS devices, e.g. n-welltype devices, wherein polycrystalline silicon and/or polycrystalline silicide gate structures are commonly subjected to n-type doping on n-channel transistors as well as on p-channel transistors in order to obtain an acceptable threshold voltage, the practice of introducing, in these integrated circuits, "buried" p-channel transistors is common. These special transistors are obtained during the fabrication process of the device by creating a thin p-doped region at the surface of n-well regions; i.e. above the channel region of a p-channel transistor. This configuration, if from one side allows appropriate adjustment of the threshold voltage value, determines far from optimal electrical characteristics especially for transistors having a very small gate length, such as a relatively steep "below ground" curve and an increased sensitivity to punch-through. Moreover, the thickness of this p-doped region below the gate of the transistor constitutes a very critical feature because a too thick layer would cause the device to operate as a depletion type MOS transistor with totally different and inadequate characteristics. Of course, with correctly inverted polarities, the same problem also arises in p-well CMOS devices as well as in twin-well devices.

OBJECTIVES AND GENERAL DESCRIPTION OF THE INVENTION

This technical problem is overcome, according to the present invention without introducing the above-noted critical modification in the fabrication process and without the need of an additional mask as in the case of such a prior art technique. In other words, by the present invention, it is no longer necessary to resort to the creation of buried channel transistors for achieving the desired threshold voltage values when devices having an extremely reduced gate length are designed for operation at relatively high supply voltages, as in nonvolatile EPROM memories.

It has also been found that for devices having a gate length of about a micrometer or a fraction thereof, requiring the use of a gate oxide having a thickness less than or equal to 200 Angstroms, it is possible to maintain the threshold voltage transistors made in the well diffusion, e.g. of the p-channel transistor in n-well devices, within an entirely satisfactory range of variation: from $-1.0$ to $-1.2$ V, without exceeding a surface concentration of $1 \times 10^{16}$ atoms of impurities per square centimeter in the diffused n-well region. This is achieved according to the present invention by performing an unmasked boron implantation over the entire surface of the silicon substrate after having formed the n-well deep diffused region so as to produce a partial compensation of the superficial doping level of the n-well region and simultaneously an enrichment of the superficial doping level of the monocrystalline p-type silicon outside the n-well regions where n-channel transistors will be made.

It has been found that by implanting boron ions in a dose comprising between $0.5 \times 10^{12}$ and $3 \times 10^{12}$ atoms per square centimeter of exposed surface of the substrate and with a kinetic energy nominally comprising between 20 and 30 KeV, n-well CMOS devices are obtained wherein the p-channel transistor threshold voltage remains contained between about $-1.0$ and $-1.2$ V, though having a gate length reduced to 0.6 micrometers. Of course the technique of the instant invention is also equally applicable in the case of p-well CMOS devices as well as in the case of the so-called twin-well CMOS devices. The additional process step required by the method of the present invention is easily performed and is compatible with each of the different architectures of these kinds of devices.

The improved CMOS fabrication process of the present invention is particularly useful for fabricaing nonvolatile, EPROM type memories, wherein for maintaining very small gate dimensions, it is necessary to provide the transistors with adequate protections against breakdown and punch-through. The introduction of an implantation process step for compensating the well region doping at the surface coupled with the possibility of utilizing arrangements such as the lightly doped drain (LDD) for transistors of one or both polarities allows the maintaining of a high breakdown voltage of the transistor formed within the well, by lowering the doping concentration of the well near the transistors's junctions without critically affecting the punch-through voltage characteristic of the same transistor, which is determined by the doping profile of a deeper portion of the well region. Simultaneously, through the same compensating implantation, the transistor formed outside the well regions receives substantially an anti punch-through implantation making it more suitable for operation at a relatively high voltage. To be noted is the fact that by carrying out the unmasked compensation implantation before growing the field oxide allows the making of the doping profiles characteristics independent in a large measure from the heat treatments required for forming the dielectric insulating layers between stacked layers of polycrystalline silicon or silicide in EPROM memories fabrication processes because the main diffusion occurs during field oxidation and the thermal balance of this step is so high as to substantially stabilize the doping profiles in respect to successive heat treatments.

DESCRIPTION OF THE PREFERRED EMBODIMENT

An example of a fabrication process for n-well CMOS devices modified in accordance with the present invention comprises the following steps:

1. formation of the deep n-well diffusion on a monocrystalline p-type silicon substrate;
2. unmasked compensating implantation of boron over the whole substrate;
3. definition and isolation of the active areas by field oxidation according to any one of the commonly used techniques;
4. formation of a gate oxide layer over the substrate surface;
5. deposition, doping and definition of a first polycrystalline silicon layer;

6. formation of the p+mask and implantation of the p+junctions;
7. formation of the n+mask and implantation of the n+junctions;
8. formation in a conventional manner of the contacts and of the interconnecting lines and completion of the final steps of the standard fabrication process.

Of course the fabrication process may also contemplate the forming of a gate of stacked polycrystalline silicon and polycristalline silicide, polycrystalline silicide, etc., as well as the formation of ligthly doped drain (LDD) transistors, the formation of spacers with material other than silicon oxides, and other known techniques as well.

Naturally, if the process of the present invention is applied for fabricating devices with a p-well architecture, the unmasked compensating implantation step on the entire substrate (step 2) will be of an n-type dopant, while in the case of fabricating devices with a twin-well architecture, the polarity of the dopant implanted during said additional step of the process will be chosen in accordance with of the specific necessity and required performances, according to considerations which will be readily made by a skilled technician on the basis of the present disclosure.

EXAMPLE

Following a standard, polycrystalline silicon gate, CMOS fabrication process, n-well CMOS devices are produced having a gate length of 0.6 $\mu$m for "low" supply voltage devices and with a 0.8 $\mu$m gate length for "high" supply voltage devices. A series of devices is fabricated by practicing the modified process in accordance with the present invention and by implanting boron over the entire substrate after having formed the deep n-well diffusions and employing a dose of about $1-2\times10^{12}$ atoms per square centimeter at 25 KeV. Another series of devices is fabricated without performing the additional unmasked compensation implantation step of the present invention and by forming buried channel, p-channel transistors in accordance with the known art.

The devices fabricated in accordance with the present invention have a threshold voltage comprised between: $-1.1$ and $-1.2$ V and a below-ground slope of 75–80 mV/decade. By contrast the devices with buried p-channel transistors made in accordance with the known technique have a below-ground slope of about 100–110 mV/decade.

The compensating boron dose implanted in accordance with the present invention is also adequate to simultaneously form an anti punch-through diffusion in n-channel transistors.

What we claim is:

1. In a process for fabricating CMOS integrated devices, the CMOS integrated devices having at least one of a polycrystalline silicon gate and a polycrystalline silicide gate, in which an n-type deep well diffusion region is formed in a portion of a surface of a p-type monocrystalline silicon substrate, and in which a transistor device having a p-type channel region is formed within the n-type deep well diffusion region, and in which a transistor device having an n-type channel region is formed external the n-type deep well diffusion region, the improvement comprising the step of:

performing an unmasked ion implantation of boron over the entire surface of the monocrystalline silicon substrate after having formed the n-type deep well diffusion region in order to effect simultaneously a partial compensation of a superficial doping level of the n-type deep well diffusion region and an enrichment of a superficial doping level of the monocrystalline silicon substrate external the n-type deep well diffusion region.

2. In a process for fabricating CMOS integrated devices as recited in claim 1, wherein the boron is implanted at a dose comprising between $0.5\times10^{12}$ and $3\times10^{12}$ atoms per square centimeter of exposed surface, and at a kinetic energy nominally comprising between 20 and 30 KeV.

* * * * *